United States Patent
Iyer et al.

(10) Patent No.: US 10,930,601 B2
(45) Date of Patent: Feb. 23, 2021

(54) FLEXIBLE FAN-OUT WAFER LEVEL PROCESS AND STRUCTURE

(71) Applicants: THE REGENTS OF THE UNIVERSITY OF CALIFORNIA, Oakland, CA (US); Subramanian S. Iyer, Los Angeles, CA (US); Takafumi Fukushima, Los Angeles, CA (US); Adeel A. Bajwa, Los Angeles, CA (US)

(72) Inventors: Subramanian S. Iyer, Los Angeles, CA (US); Takafumi Fukushima, Los Angeles, CA (US); Adeel A. Bajwa, Los Angeles, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 115 days.

(21) Appl. No.: 16/345,135

(22) PCT Filed: Oct. 30, 2017

(86) PCT No.: PCT/US2017/059028
§ 371 (c)(1),
(2) Date: Apr. 25, 2019

(87) PCT Pub. No.: WO2018/081705
PCT Pub. Date: May 3, 2018

(65) Prior Publication Data
US 2019/0287927 A1    Sep. 19, 2019

Related U.S. Application Data

(60) Provisional application No. 62/415,250, filed on Oct. 31, 2016.

(51) Int. Cl.
*H01L 23/00* (2006.01)
*H01L 21/56* (2006.01)
(Continued)

(52) U.S. Cl.
CPC .......... *H01L 23/562* (2013.01); *H01L 21/565* (2013.01); *H01L 23/5386* (2013.01);
(Continued)

(58) Field of Classification Search
CPC ....... H01L 21/56; H01L 23/00; H01L 23/532; H01L 24/01; H01L 24/07; H01L 24/08;
(Continued)

(56) References Cited

U.S. PATENT DOCUMENTS 7,274,107 B2 * 9/2007 Hedler ................... H01L 24/32
257/783
2003/0030138 A1    2/2003 Kim
(Continued)

OTHER PUBLICATIONS

International Search Report and Written Opinion, issued in Int'l. Appln. No. PCT/US2017/059028, 10 pages (dated Mar. 16, 2018).

*Primary Examiner* — Alexander O Williams
(74) *Attorney, Agent, or Firm* — Foley & Lardner LLP

(57) ABSTRACT

A fan-out wafer level package includes: (1) a flexible substrate; (2) a semiconductor component embedded in the flexible substrate, the semiconductor component including an active surface that is exposed from the flexible substrate, the semiconductor component including a bonding pad adjacent to the active surface; (3) a stress buffer layer disposed over the flexible substrate and the semiconductor component, the stress buffer layer defining an opening exposing the bonding pad of the semiconductor component; and (4) an interconnect disposed over the stress buffer layer and including a portion extending into the opening of the stress buffer layer to electrically connect to the bonding pad of the semiconductor component.

20 Claims, 11 Drawing Sheets

(51) Int. Cl.
  *H01L 23/538* (2006.01)
  *H01L 27/12* (2006.01)
  *H01L 23/31* (2006.01)

(52) U.S. Cl.
  CPC ...... *H01L 23/5387* (2013.01); *H01L 23/5389* (2013.01); *H01L 24/09* (2013.01); *H01L 24/19* (2013.01); *H01L 24/32* (2013.01); *H01L 24/97* (2013.01); *H01L 27/1218* (2013.01); *H01L 21/568* (2013.01); *H01L 23/3121* (2013.01); *H01L 2224/02379* (2013.01); *H01L 2224/16225* (2013.01); *H01L 2224/18* (2013.01); *H01L 2224/45015* (2013.01); *H01L 2224/48091* (2013.01); *H01L 2924/00014* (2013.01); *H01L 2924/3511* (2013.01)

(58) Field of Classification Search
  CPC ......... H01L 24/10; H01L 24/14; H01L 24/19; H01L 24/25; H01L 24/065; H01L 28/75; H01L 21/561; H01L 23/3171; H01L 23/48; H01L 23/5329; H01L 25/065; H01L 25/0652; H01L 2224/12105; H01L 2224/24137; H01L 2221/92142; H01L 2221/97; H01L 2924/15; H01L 2924/151; H01L 2924/156; H01L 2024/15172; H01L 23/562; H01L 23/5387; H01L 23/5386; H01L 24/09; H01L 24/32; H01L 21/565; H01L 2224/02379; H01L 24/20; H01L 24/97; H01L 27/1218; H01L 24/96; H01L 2224/45015; H01L 2224/48091; H01L 2224/16225; H01L 2224/04105; H01L 2225/02379; H01L 2924/00014; H01L 2924/3511; H01L 21/568; H01L 2924/19107; H01L 23/3121; H01L 2224/18; H01L 2224/96; H01L 2924/10253; H01L 2924/20752; H01L 2224/45099; H01L 2924/00; H01L 23/5389; H01L 224/48091; H01L 224/45015
  USPC .......................................................... 257/690
  See application file for complete search history.

(56) References Cited

U.S. PATENT DOCUMENTS

| | | | |
|---|---|---|---|
| 2004/0087043 A1* | 5/2004 | Lee .......................... | H01L 23/04 438/6 |
| 2006/0163727 A1* | 7/2006 | Hedler ................ | H01L 23/3128 257/738 |
| 2011/0156240 A1 | 6/2011 | Luan et al. | |
| 2015/0008587 A1 | 1/2015 | Lin et al. | |
| 2015/0021754 A1* | 1/2015 | Lin ..................... | H01L 23/5389 257/712 |
| 2015/0091167 A1 | 4/2015 | Geissler et al. | |
| 2015/0179616 A1* | 6/2015 | Lin ......................... | H01L 24/19 257/773 |
| 2016/0049384 A1 | 2/2016 | Lu et al. | |
| 2016/0300797 A1* | 10/2016 | Shim .................... | H01L 23/5389 |
| 2018/0066107 A1* | 3/2018 | Shoji ....................... | C08L 79/02 |
| 2019/0112180 A1* | 4/2019 | Yap ..................... | B81C 1/00095 |
| 2019/0256655 A1* | 8/2019 | Masuda ............... | H01L 29/786 |

\* cited by examiner

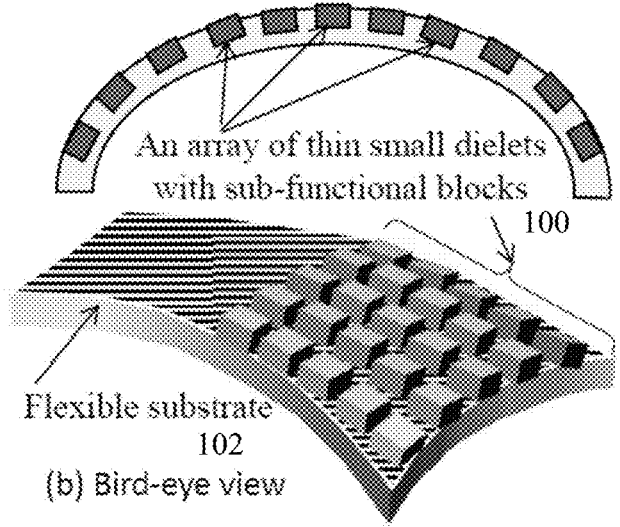
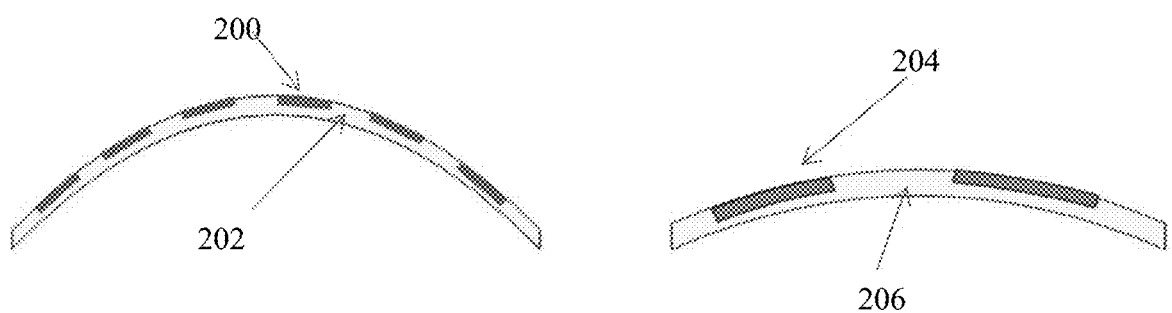
Fig. 1
Fig. 2

FLEXIBLE FAN-OUT WAFER LEVEL PROCESS AND STRUCTURE

CROSS-REFERENCE TO RELATED APPLICATION

This application is a U.S. national stage of International Application No. PCT/US2017/059028, filed on Oct. 30, 2017, which claims the benefit of U.S. Provisional Application No. 62/415,250, filed on Oct. 31, 2016, the contents of which are incorporated herein by reference in their entireties.

STATEMENT REGARDING FEDERALLY SPONSORED RESEARCH OR DEVELOPMENT

This invention was made with Government support under N00014-16-1-2639, awarded by the U.S. Navy, Office of Naval Research. The Government has certain rights in the invention.

TECHNICAL FIELD

This disclosure generally relates to wafer level processes and structures.

BACKGROUND

Current fan-out wafer level process (FOWLP) technologies are generally focused on rigid device fabrication and can suffer from serious wafer bow due to the use of high stress mold resins. On the other hand, roll-to-roll technologies are used for flexible device fabrication, but a size deformation in a large area sheet-level processing is a hurdle for the formation of fine pitch wirings that specify high accuracy alignment. In view of these hurdles, current flexible devices are typically fabricated by a combination of a rigid substrate with mounted dies connected to a flexible device fabricated by roll-to-roll technologies by which low-performance organic semiconductor components and coarse wirings are formed by low-resolution photolithography or one-by-one printable processing.

It is against this background that a need arose to develop the embodiments described herein.

SUMMARY

In some embodiments, a fan-out wafer level package includes: (1) a flexible substrate; (2) a semiconductor component embedded in the flexible substrate, the semiconductor component including an active surface that is exposed from the flexible substrate, the semiconductor component including a bonding pad adjacent to the active surface; (3) a stress buffer layer disposed over the flexible substrate and the semiconductor component, the stress buffer layer defining an opening exposing the bonding pad of the semiconductor component; and (4) an interconnect disposed over the stress buffer layer and including a portion extending into the opening of the stress buffer layer to electrically connect to the bonding pad of the semiconductor component.

In some embodiments of the fan-out wafer level package, the flexible substrate includes a flexible material.

In some embodiments of the fan-out wafer level package, the flexible material is an elastomer or a gel.

In some embodiments of the fan-out wafer level package, the flexible material has a Young's modulus of up to about 3 MPa.

In some embodiments of the fan-out wafer level package, the flexible material has a percentage elongation-at-break of at least about 5%.

In some embodiments of the fan-out wafer level package, the interconnect extends beyond a lateral periphery of the semiconductor component.

In some embodiments of the fan-out wafer level package, the package further includes a flexible layer disposed over the flexible substrate, the stress buffer layer, and the interconnect, and the flexible layer defines an opening exposing a fan-out portion of the interconnect.

In some embodiments of the fan-out wafer level package, the package further includes a fan-out contact or electrode disposed over the fan-out portion of the interconnect.

In some embodiments of the fan-out wafer level package, the flexible layer includes an elastomer or a gel.

In some embodiments of the fan-out wafer level package, the stress buffer layer includes a resin.

In some embodiments of the fan-out wafer level package, the flexible substrate includes a top surface, the active surface of the semiconductor component is exposed from the flexible substrate adjacent to the top surface of the flexible substrate, and a distance (e.g., in terms of a vertical displacement) between the active surface of the semiconductor component and the top surface of the flexible substrate is up to about 30 μm.

In some embodiments of the fan-out wafer level package, the semiconductor component is a first semiconductor component, and the package further includes a second semiconductor component embedded in the flexible substrate, and the second semiconductor component includes an active surface that is exposed from the flexible substrate.

In some embodiments of the fan-out wafer level package, a thickness of the first semiconductor component is different from a thickness of the second semiconductor component.

In some embodiments of the fan-out wafer level package, a distance (e.g., in terms of a vertical displacement) between the active surface of the first semiconductor component and the active surface of the second semiconductor component is up to about 30 μm.

In additional embodiments, a fan-out wafer level process includes: (1) forming a first adhesive layer over a first handler; (2) affixing semiconductor components to the first adhesive layer and the first handler, with active surfaces of the semiconductor components facing the first adhesive layer; (3) applying a flexible material over the semiconductor components and the first adhesive layer; (4) forming a second adhesive layer over a second handler; (5) curing the flexible material with the second handler and the second adhesive layer applied over the flexible material, with the flexible material facing the second adhesive layer, thereby forming a flexible substrate in which the semiconductor components are embedded; and (6) releasing the flexible substrate and the semiconductor components from the first adhesive layer and the first handler.

In some embodiments of the fan-out wafer level process, the semiconductor components include a first die and a second die, and the first die and the second die have different thicknesses.

In some embodiments of the fan-out wafer level process, the flexible material is an elastomer or a gel.

In some embodiments of the fan-out wafer level process, the process further includes forming interconnects over the semiconductor components and the flexible substrate.

In some embodiments of the fan-out wafer level process, the process further includes releasing the flexible substrate, the semiconductor components, and the interconnects from the second adhesive layer and the second handler.

In some embodiments of the fan-out wafer level process, the process further includes, prior to forming the interconnects, applying a treatment to a surface of the flexible substrate to render the surface to be hydrophilic, and at least a portion of the interconnects is formed over the treated, hydrophilic surface of the flexible substrate.

Further embodiments are directed to a fan-out wafer level assembly system, which includes a die bonder, a compression mold system, and a wafer bonder.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

FIG. 1. Bendable configuration of small dielets integrated in a flexible substrate in a cross-sectional view (a) and a perspective view (b).

FIG. 2. Comparison of flexibility of two configurations of a flexible device.

DETAILED DESCRIPTION

Figure 3:
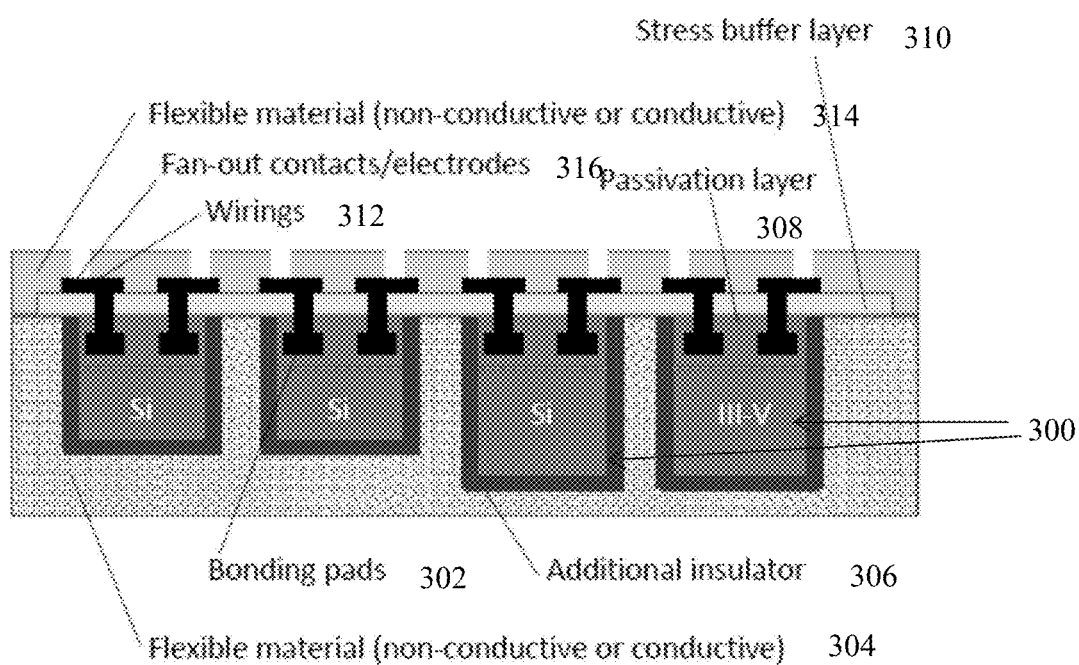
FIG. 3. Structure of a flexible device.

Embodiments of this disclosure are directed to an improved FOWLP which is adapted to flexible substrates using an improved process which allows for fine pitch interconnects. In some embodiments, low stress resins, such as polydimethylsiloxane (PDMS) and silicone-modified epoxies, can be used in this flexible FOWLP, and small dies (or dielets) can be embedded into such a flexible resin in a face-up configuration. In such manner, high-performance dielets, such as silicon (Si) and III-V semiconductor dielets, can be used, and fine pitch on-die/off-die interconnects can be formed in wafer level batch processing. Resulting flexible structures can be beneficial for various applications, including as biocompatible flexible devices for use as wearable sensors and implantable electrodes, and other applications for flexible electronics.

A structure of a flexible device fabricated using a flexible FOWLP is shown in FIG. 1 according to some embodiments. Instead of a large rigid die or semiconductor chip, small-sized semiconductor components in the form of dielets 100 are included as sub-functional blocks, and the dielets 100 are embedded into a flexible substrate 102. The flexibility of the device is provided through use of a low stress resin for the flexible substrate 102 and by embedding the small dielets 100 that are spaced apart in an array. The dielets 100 can flex somewhat but the space between the dielets occupied by the resin can flex even more. The small dielets 100 are interconnected with fine pitch interconnects formed by the flexible FOWLP in wafer-level batch processing, thereby connecting the sub-functional blocks to form a functional system. Various dielets with different thicknesses can be embedded into the flexible substrate 102, thereby allowing heterogeneous system integration.

FIG. 2 compares flexibility of two configurations of a device fabricated using a flexible FOWLP according to some embodiments. In the left panel, smaller sized dies 200 are embedded into a flexible substrate 202, while, in the right panel, larger sized dies 204 are embedded into a flexible substrate 206. As depicted, the use of the smaller sized dies 200 lends greater flexibility to the device, as manifested by, for example, a larger tolerated bending angle without noticeable damage or performance impact. In some embodiments, a size of the dies 200 can be up to a few millimeters (mm) on each side to lend greater flexibility, such up to about 10 mm, up to about 8 mm, up to about 6 mm, up to about 4 mm, up to about 2 mm, or up to about 1 mm, and down to about 0.5 mm or less. In some embodiments, the dies 200 can be subjected to thinning to lend even greater flexibility, such as having a thickness up to a few hundred microns (μm), or up to about 200 μm, up to about 150 μm, up to about 100 μm, or up to about 80 μm, and down to about 50 μm or less.

FIG. 3 illustrates additional details of a structure of a flexible device according to some embodiments. As shown in FIG. 3, the device is a fan-out wafer level package, and includes multiple semiconductor components 300 each including multiple bonding pads 302. The semiconductor components 300 are inorganic semiconductor dies, such as dies based on, or including, Si, a III-V semiconductor, or other inorganic semiconductors. Although four semiconductor components are shown in FIG. 3, more or less semiconductor components can be included in other embodiments.

The semiconductor components 300 are embedded into a flexible substrate 304, which serves as an encapsulant covering side surfaces and back surfaces of the semiconductor components 300, while top, active surfaces of the semiconductor components 300 are exposed from the flexible substrate 304. The semiconductor components 300 can have different thicknesses, although the top surfaces of the semiconductor components 300 can be substantially coplanar with respect to one another, such that a distance (e.g., in terms of a vertical displacement along a direction perpendicular to a top surface of the flexible substrate 304) between a highest point and a lowest point among the top surfaces is up to about 30 µm, up to about 20 µm, up to about 10 µm, up to about 5 µm, up to about 3 µm, or up to about 1 µm or less. Also, the top surfaces of the semiconductor components 300 can be substantially coplanar with respect to the top surface of the flexible substrate 304, such that a distance (e.g., in terms of a vertical displacement along a direction perpendicular to the top surface of the flexible substrate 304) between the top surface of each semiconductor component 300 and the top surface of the flexible substrate 304 is up to about 30 µm, up to about 20 µm, up to about 10 µm, up to about 5 µm, up to about 3 µm, or up to about 1 µm or less. As shown in FIG. 3, an insulating material 306 is optionally disposed between the side surfaces and the back surfaces of the semiconductor components 300 and the flexible substrate 304.

The flexible substrate 304 is formed of, or includes, a flexible or soft material, which, in general, can be an insulating material or a conductive material. Suitable flexible materials can have one or both of the following properties: 1) relatively soft with a Young's modulus of up to about 100 MPa, up to about 90 MPa, up to about 80 MPa, up to about 70 MPa, up to about 60 MPa, up to about 50 MPa, up to about 40 MPa, up to about 30 MPa, up to about 20 MPa, up to about 10 MPa, up to about 5 MPa, up to about 3 MPa, up to about 2 MPa, up to about 1 MPa, or up to about 0.1 MPa; and 2) relatively high percentage elongation-at-break of at least about 5%, at least about 10%, at least about 20%, at least about 30%, at least about 50%, at least about 70%, at least about 100%, at least about 150%, at least about 200%, at least about 300%, or at least about 400%, and up to about 500% or more. Some suitable flexible materials can have a low glass transition temperature below room temperature or below about 25° C., such as no greater than about 20° C., no greater than about 10° C., no greater than about 0° C., no greater than about −5° C., no greater than about −10° C., no greater than about −15° C., or no greater than about −20° C., and down to about −30° C., down to about −50° C., or down to about −120° C. or less, although other suitable flexible materials can have a glass transition temperature at or above room temperature. Examples of suitable flexible materials include elastomers (e.g., silicones (such as PDMS), polyurethanes, or polyacrylates) and materials derived or formed from thermo- or photo-curable resins (e.g., epoxy resins, polyimide, or gels).

As shown in FIG. 3, the device also includes a passivation layer 308 disposed over and covering the top surfaces of the semiconductor components 300. The passivation layer 308 is formed of, or includes, an insulating material. Examples of suitable insulating materials include resins (e.g., polyimide, polybenzoxazole (PBO), or epoxy-based photoresist (such as SU-8)) and dielectric materials (e.g., oxides such as $SiO_2$). The passivation layer 308 is formed with, or defines, openings or through holes exposing the bonding pads 302 of the semiconductor components 300.

A stress buffer layer 310 is included so as to be disposed over the flexible substrate 304 and the semiconductor components 300 and covering a top surface of the passivation layer 308 and the top surface of the flexible substrate 304. The stress buffer layer 310 is formed of, or includes, an insulating material. Examples of suitable insulating materials include resins (e.g., epoxy-based photoresist (such as SU-8) or parylenes). The stress buffer layer 310 is formed with, or defines, openings or through holes, which are aligned with openings of the passivation layer 308 so as to expose the bonding pads 302 of the semiconductor components 300.

As shown in FIG. 3, interconnects 312 in the form of wirings are disposed over the stress buffer layer 310 and include portions extending into the openings of the stress buffer layer 310 and the passivation layer 308 so as to electrically connect to the bonding pads 302 of the semiconductor components 300. Portions of the interconnects 312 extend over the stress buffer layer 310 beyond a lateral periphery of at least one semiconductor component 300. Although not explicitly depicted in FIG. 3, at least some of the interconnects 312 can be electrically connected to one another, or can be integrally formed with one another, so as to electrically connect the semiconductor components 300 and form a functional system.

A flexible layer 314 is included so as to be disposed over the flexible substrate 304 and the semiconductor components 300 and covering a top surface of the stress buffer layer 310, the top surface of the flexible substrate 304, and the interconnects 312. The flexible layer 314 is formed of, or includes, a flexible or soft material, which, in general, can be an insulating material or a conductive material. Examples of suitable flexible materials include those discussed above for the flexible substrate 304. The flexible layer 314 is formed with, or defines, openings or through holes, which expose fan-out portions of the interconnects 312. A fan-out structure is disposed over the exposed fan-out portions of the interconnects 312, and includes fan-out contacts and fan-out electrodes 316 which are electrically connected to the bonding pads 302 of the semiconductor components 300 through the interconnects 312. The fan-out contacts 316 are configured for external connection to another device and are formed of, or include, a conductive material such as a metal or metal alloy (e.g., copper (Cu) or gold (Au)) or a solder, and the fan-out electrodes 316 are configured for sensing or applying a stimulation and are formed of, or include, a conductive material such as a metal or metal alloy (e.g., platinum (Pt) or Au), a metal oxide (e.g., $IrO_2$), or a conductive polymer (e.g., poly(3,4-ethylenedioxythiophene) or PEDOT).

Although not explicitly depicted in FIG. 3, one or more passive components (e.g., resistors, inductors, or capacitors) can be included in the device, and can be electrically connected to the semiconductor components 300 through the interconnects 312. The passive components can be embedded into the flexible substrate 304, or can be disposed at other locations, such as within or covered by the flexible layer 314.

Figure 4:
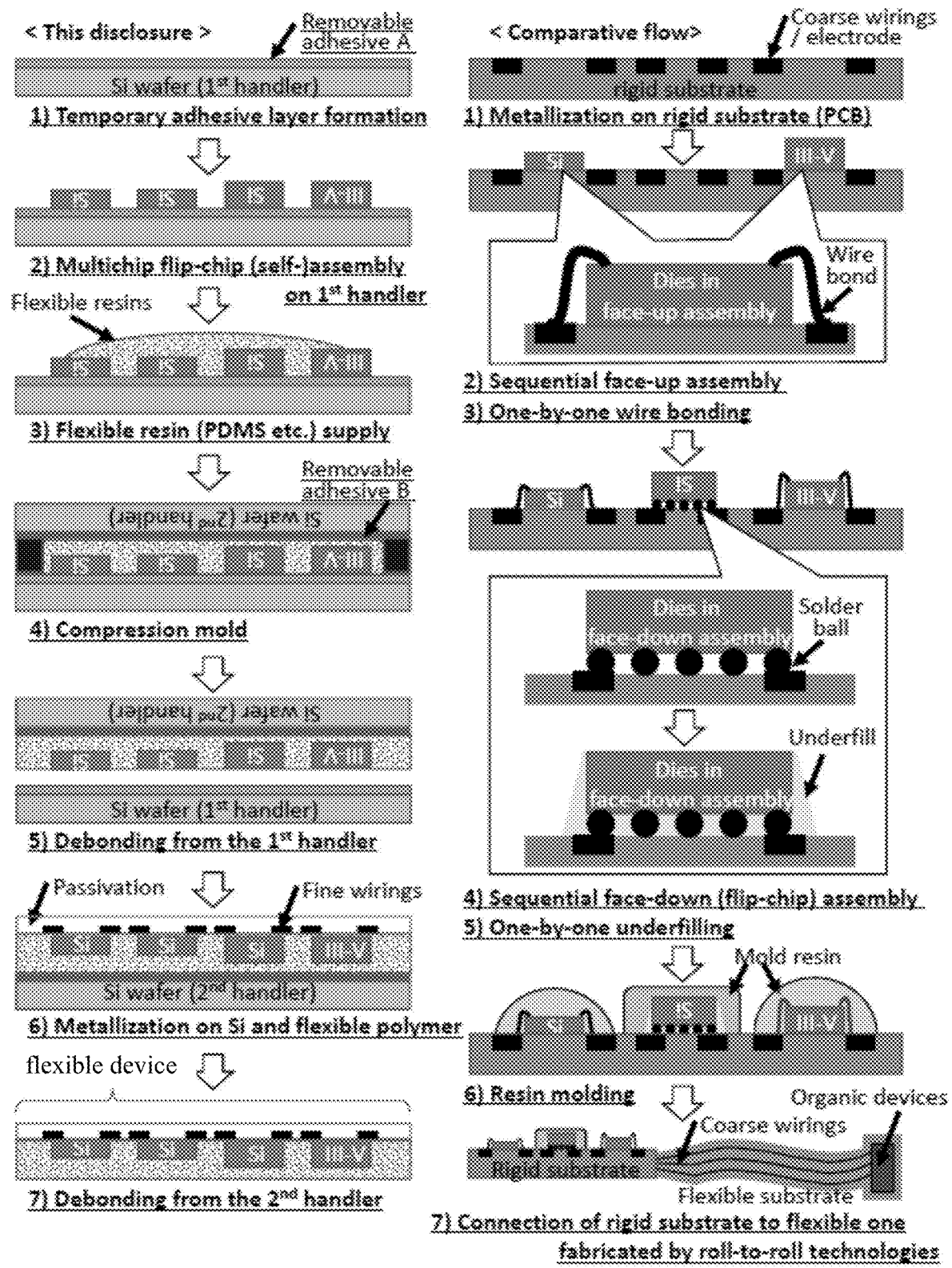
FIG. 4. Process flow and intermediate structures during fabrication of a device by a flexible FOWLP, in comparison with a comparative process flow.

FIG. 4 shows a process flow and intermediate structures during fabrication of a device by a flexible FOWLP according to some embodiments, in comparison with a comparative process flow involving a combination with large chips mounted on a rigid substrate connected to a flexible device fabricated by roll-to-roll processing.

In the flexible FOWLP, first, a removable adhesive layer A is formed over a first handler, such as a silicon wafer or other silicon carrier. The first handler can be conveyed and secured by a wafer bonder. As depicted in FIG. 4, the adhesive layer A is a thermally removable adhesive layer, although adhesive layers that are photochemically removable also can be used. Specifically, the adhesive layer A is thermally removable at a first release temperature or a first release temperature range, such as about 90° C. to about 120° C. The adhesive layer A can be formed of an adhesive which is applied by spinning or other coating technique. A thickness of the adhesive layer A can be up to about 100 µm, up to about 90 µm, up to about 80 µm, up to about 70 µm, up to about 60 µm, up to about 50 µm, up to about 40 µm, up to about 30 µm, up to about 20 µm, up to about 15 µm, up to about 5 µm, or up to about 1 µm.

Then, semiconductor components in the form of small dies are disposed over the adhesive layer A and are affixed to the adhesive layer A active side down, with their active surfaces facing the adhesive layer A. Placement of the semiconductor components in an array can be performed using a die bonder, a die tray, or capillary self-assembly. In some embodiments, placement of multiple ones of the semiconductor components can be performed in parallel, such as through multi-die assembly. An insulating material is optionally disposed over side surfaces and back surfaces of the semiconductor components.

After that, a flexible material (or a precursor thereof), such as a flexible resin like a biocompatible PDMS, is applied over the die-on-handler structure. Specifically, the flexible material is applied over the semiconductor components and the adhesive layer A by spinning or other coating technique, followed by curing and compression molding using a compression mold system. As depicted in FIG. 4, compression molding is performed with a second handler having a removable adhesive layer B applied over the flexible material covering the semiconductor components. The adhesive layer B is a thermally removable adhesive layer, although adhesive layers that are photochemically removable also can be used. Specifically, the adhesive layer B is thermally removable at a second release temperature or a second release temperature range which is greater than the first release temperature of the adhesive layer A, such as about 150° C. or above. Compression molding is performed at a temperature or a temperature range below the first release temperature of the adhesive layer A and below the second release temperature of the adhesive layer B, such that the flexible material and the semiconductor components remain affixed to the adhesive layers A and B. As a result, a flexible substrate is formed in which the semiconductor components are embedded.

Next, multi-die transfer from the first handler to the second handler is performed. Specifically, the flexible substrate and the semiconductor components are released from the adhesive layer A and the first handler by heating to the first release temperature of the adhesive layer A, while the flexible substrate and the semiconductor components remain affixed to the adhesive layer B.

With the active surfaces of the semiconductor components exposed, metallization processing is next performed over the array of the semiconductor components and a top surface of the flexible substrate at a wafer level, thereby forming a passivation layer, a stress buffer layer, interconnects, a flexible layer, and fan-out contacts and electrodes.

Finally, a resulting flexible device is released from the adhesive layer B and the second handler by heating to the second release temperature of the adhesive layer B. A thickness of the flexible device can be controlled to be relatively thin so as to lend greater flexibility to the device. Control over the thickness can be performed by controlling an amount of the flexible material applied to cover the semiconductor components, without requiring grinding or chemical-mechanical polishing. For example, the thickness of the flexible device can be up to a few hundred µm, or up to about 500 µm, up to about 400 µm, up to about 300 µm, up to about 200 µm, or up to about 150, and down to about 100 µm or less.

In comparison, the comparative process flow involves the use of a rigid substrate, such as a printed circuit board (PCB), on which large rigid chips are assembled one-by-one. For example, chips used for face-up configuration are assembled active side up on the rigid substrate via die bonding. Subsequently, the chips are interconnected by bonding wires with a diameter of about 20 µm or greater and a length up to several mm. After that, other chips used for face-down configuration are assembled active side down on the rigid substrate via flip-chip bonding. Solder ball or microbumps are formed on the chips prior to the flip-chip bonding. Next, an underfill resin is injected into a narrow gap between the chips and the rigid substrate. Since the various stages are sequentially performed, a production throughput can be low. Then, the rigid substrate with mounted chips is connected to a flexible device fabricated by roll-to-roll technologies by which low-performance organic semiconductor components and coarse wirings are formed by low-resolution photolithography or one-by-one printable processing.

EXAMPLE

The following example describes specific aspects of some embodiments of this disclosure to illustrate and provide a description for those of ordinary skill in the art. The example should not be construed as limiting this disclosure, as the example merely provides specific methodology useful in understanding and practicing some embodiments of this disclosure.

Scaled Heterogeneous Integration on Flexible Biocompatible Substrates

Overview:

This example sets forth a fan-out wafer level process (FOWLP) for flexible and biocompatible applications. The technology is demonstrated with the assembly of 625 about 1 mm×about 1 mm dielets (Si and GaAs) in polydimethylsiloxane (PDMS). About 10 µm pitch die-die interconnects were implemented with Cr/Au using wafer level processing.

Figure 5:
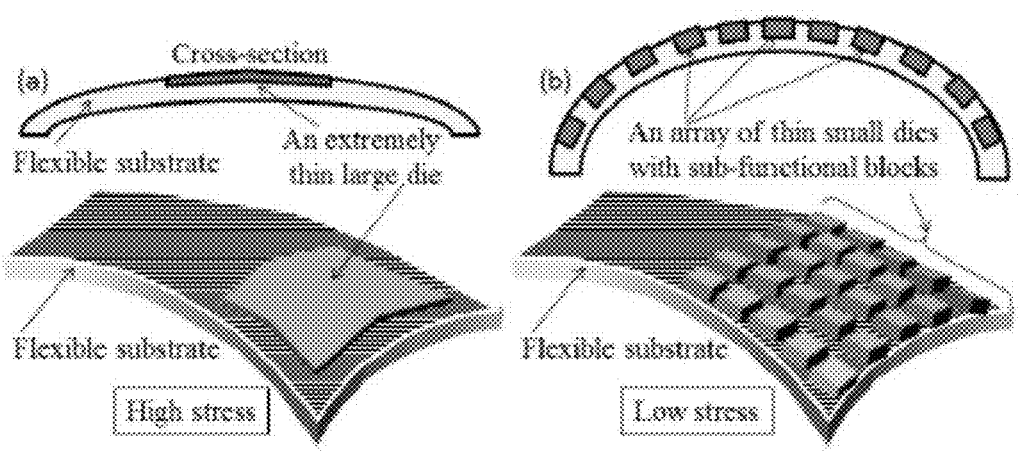
FIG. 5. Configuration of bendable single crystalline dies integrated in a flexible substrate.

Introduction:

Flexible electronics is increasingly important in both Internet of Things (IoT) and wearable and medical applications. Packaging is also undergoing a renaissance, with the adoption of silicon like wafer level processing techniques to packaging of both single and multi-dies called FOWLP and its variants on rigid substrates to greatly increase both connectivity and form factor compared to laminate based packaging. This FOWLP is adapted to biocompatible flexible substrates using an improved process which allows for much tighter interconnects compared to roll-roll and flexible panel processing. The improved process leverages both the flexible substrate as well as thinned small dies and a completed structure is similar to a chain link where the link themselves have some flexibility as depicted schematically in FIG. 5.

Figure 6:
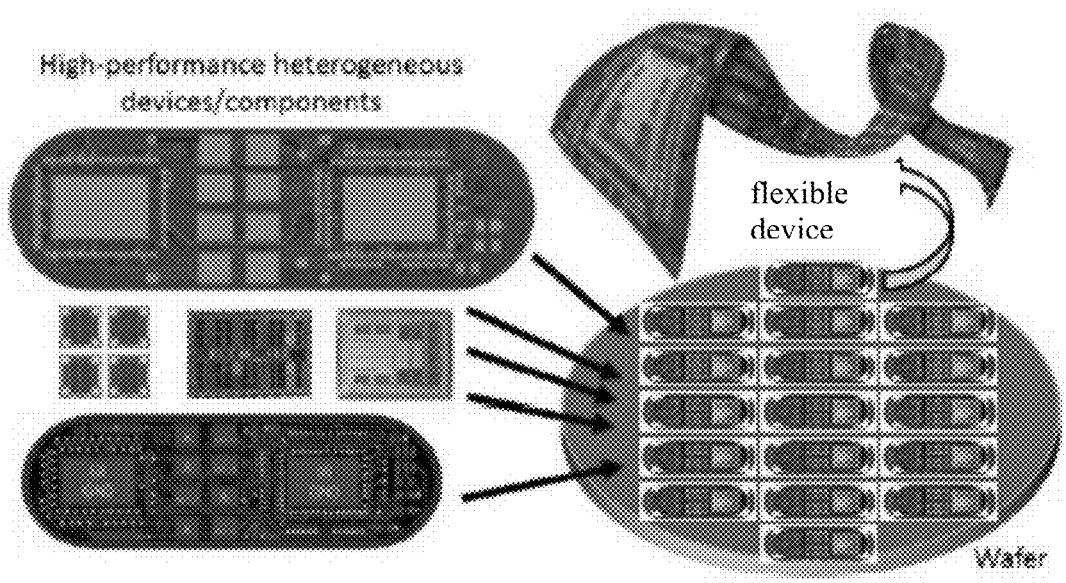
FIG. 6. Concept of high-performance and scalable flexible substrate technology based on wafer level processing.

FIG. 6 shows a concept of the technology where thinned heterogeneous dies are assembled in flexible substrates. A die size is selected to at most a few mm on a side to aid the flexible link concept. These thinned dies flex somewhat but the space between the links can flex more. The smaller thinner dies can follow the flexure with less stress and total warpage. In addition, small dies such as sensors, laser diodes, μ-light emitting diode (LED), and passive devices are included for heterogeneous system integration, and also have an advantage of higher yield.

In the present example, an improved process is demonstrated using capillary self-assembly with water surface tension and multi-chip transfer from a carrier wafer to another handler. Based on wafer level processing, the feasibility of the improved process is evaluated, characterization is made of fine-pitch wirings formed on a biocompatible PDMS as a flexible substrate in which hundreds of 1-mm-square small dies are embedded and interconnected.

Experimental:

A. Flexible FOWLP process

Figure 7:
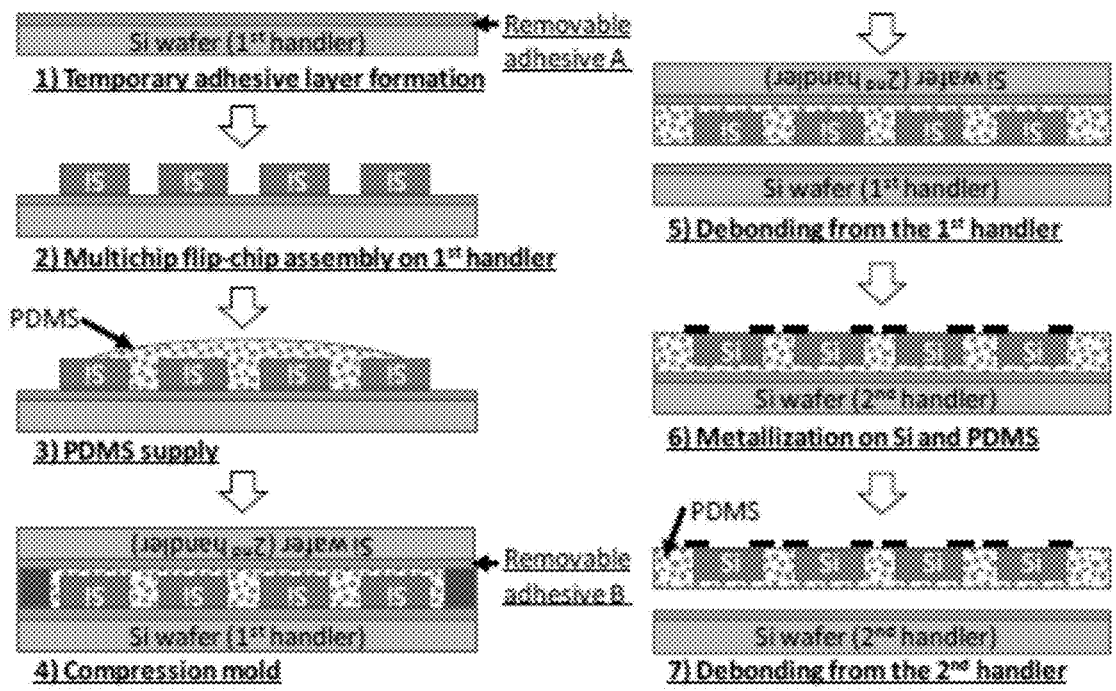
FIG. 7. A process flow of fabrication using flexible FOWLP.

FIG. 7 shows a process flow using flexible FOWLP. First, a thin thermally removable (at about 100-120° C.) temporary adhesive layer was formed on a first Si handler. Then, small dielets were precision self-assembled, active side down, on an adhesive surface of the handler. After that, a biocompatible PDMS was applied on the chip-on-wafer structure, followed by curing and compression soft-molding with a second Si handler having another temporary adhesive layer that is removable at about 150° C. After multi-chip transfer from the first handler to the second handler at about 120° C. or below, metallization processes were performed on the array of the dies and the surrounding PDMS at the wafer level. Finally, the resulting structure was thermally removed from the second handler at about 150° C. or above to yield high-performance flexible substrates with the embedded dies.

B. Biocompatible PDMS

The mechanical, electrical, and thermal characteristics of the biocompatible PDMS are summarized in Table 1. The PDMS shows good electrical properties such as low dielectric constant, low dissipation factor, and high breakdown voltage, compared to epoxy resins used in FOWLP. However, this biocompatible material has a high coefficient of thermal expansion (CTE) with respect to both Si and Cu (about 300 vs. about 3 and about 17 ppm/K, respectively). Since a glass transition temperature and Young's modulus are very low, the resulting structure is low stress over the entire substrate without significant global wafer bow and without localized keep-out zone (KOZ). In addition, the PDMS is thermally stable at about 200° C. or above.

TABLE 1

Properties of a biocompatible PDMS

| Properties | Biocompatible PDMS |
|---|---|
| Hardness | 30 (Shore A) |
| Tensile strength | 5 (MPa) |
| Elongation at break | ~500% |
| Dielectric constant @ 100 kHz | 3.0 (3.01@100 Hz) |
| Dissipation factor @ 100 KHz | 0.001 (0.0009@100 Hz) |
| Volume resistivity | $2 \times 10^{15}$ (Ω · cm) |
| CTE | ~300 (ppm/K) |
| Young modulus | 0.5 (MPa) |
| Tg | −120 (° C.) |
| Thermal decomposition temp. | 200 (° C.) or more |
| Screening test | Applicable to products intended for implantation in the human body for up to 29 days |

Figure 8:
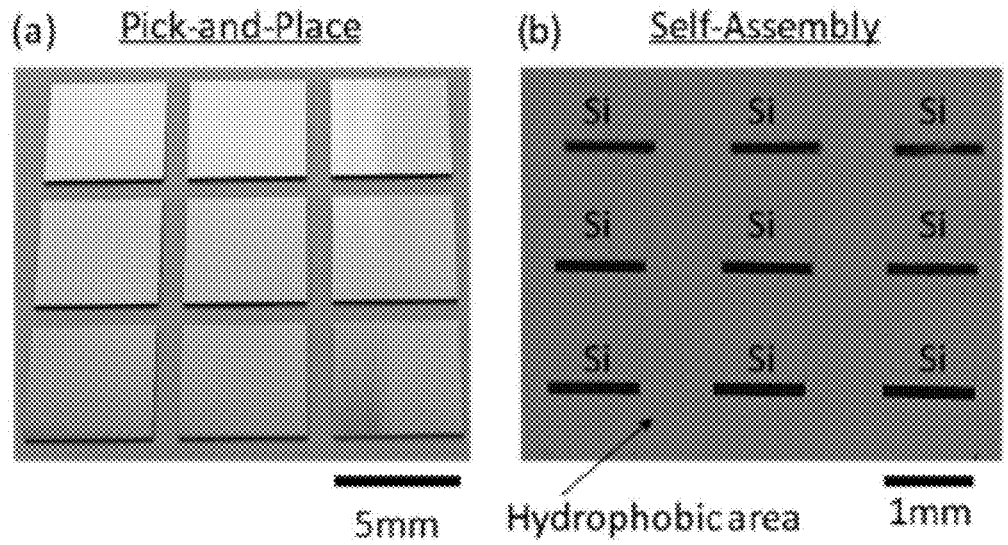
FIG. 8. Multi-die placement by a Chip-to-Wafer (CtW) flip-chip bonder (a) and capillary self-assembly (b).
Figure 9:
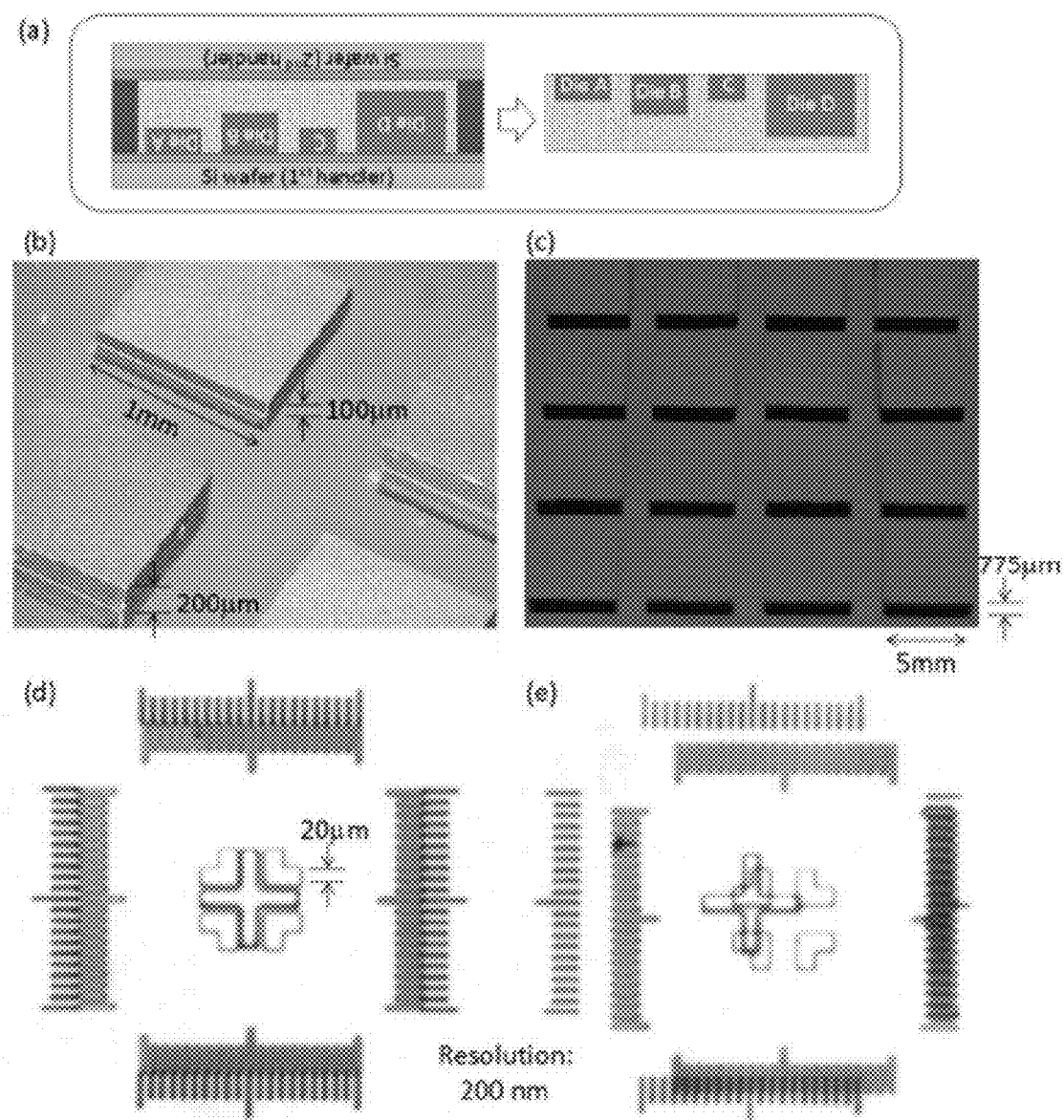
FIG. 9. Hetero integration of multi-dies with various thickness (a)-(c) and IR images of vernier patterns obtained from about 100 μm thick dies (d) and about 775 μm thick dies (e).

Results and Discussion:

As shown in FIG. 8, a die bonder (KNS, APAMA) can precisely align dielets and place them with precision on the temporary adhesive layer formed on the first Si handler. By optimizing the assembly conditions, high alignment accuracies with 3σ of ±2 μm are obtained. However, the one-by-one pick-and-place die assembly has a tradeoff between assembly throughput and accuracy. In addition, multi-chip assembly allowing simultaneous bonding with large numbers of dies is challenging even if several bonding heads are installed into the die bonder. In contrast, as is also shown in FIG. 8, a capillary self-assembly method using the surface tension of water can precisely place a large number of about 1 mm square small dies at once on the temporary adhesive layer in batch processing. The self-assembly method can place heterogeneous dielets with various thickness. By using the flexible FOWLP technology, dies having different heights can be assembled, and their top surfaces are planarized by low temperature compression mold with PDMS as shown in FIG. 9(a). In FIGS. 9(b) and (c), different dies ranging in thickness from about 100 μm to about 775 μm are self-assembled on host substrates. FIGS. 9(d) and (e) show IR images of a pair of verniers and alignment marks (cross and corresponding step patterns). The former cross patterns are formed on a die to be self-assembled and the latter step patterns are formed on the host handler. As shown in the IR images of FIG. 9(d), high alignment accuracy within about 0.2 μm is attained when the about 100 μm thick thin dies are employed for self-assembly: the 3σ is found to be about 1-2 μm by conditioning the parameters such as die size accuracy, pre-alignment position, liquid volume, and wettability contrast between hydrophilic assembly areas and the surrounding hydrophobic region. On the other hand, the alignment accuracies decreased when using very thick dies with a thickness of about 775 μm due to their greater weight per unit of liquid volume (assembly area), which is higher than a restoring force driven by water surface tension. The space between dielets can be precisely controlled in both cases. There is a tradeoff between the interconnect performance (wire length) and flexure—greater inter-die spaces having longer wires yielding greater flexural stability. Wire resistance can be compensated by increasing interconnect pitch.

Figure 10:
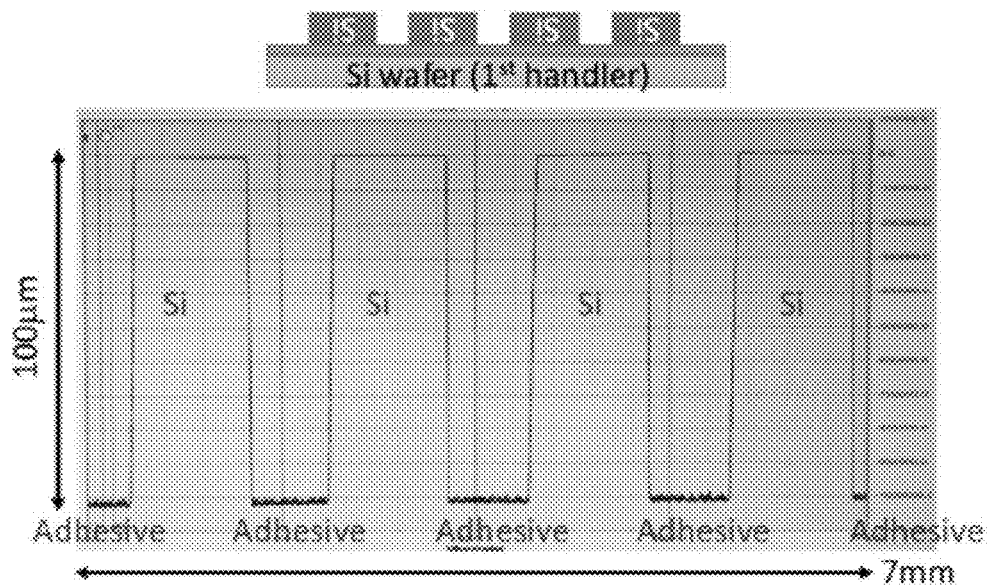
FIG. 10. A surface profile of multi-dies placed on a first temporary adhesive layer formed on a first silicon (Si) handler.
Figure 11:
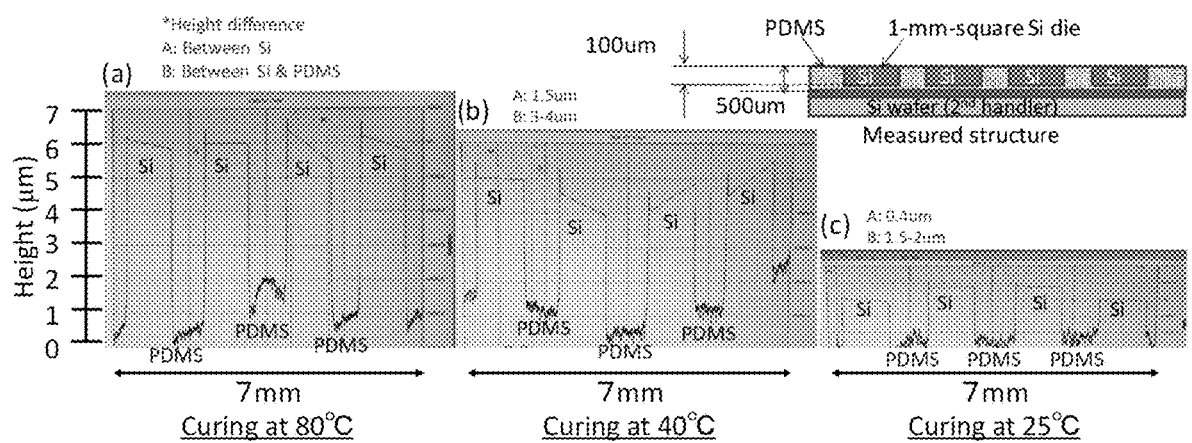
FIG. 11. Impact of curing temperature on surface profiles of Si/polydimethylsiloxane (PDMS) after transfer to a second temporary adhesive layer (second Si handler).
Figure 12:
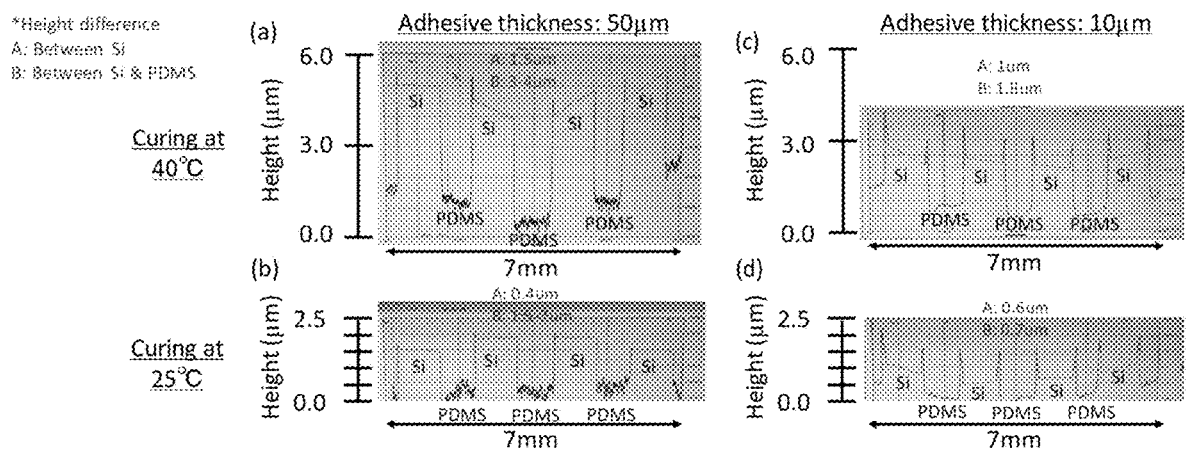
FIG. 12. Impact of a first adhesive layer thickness on surface profiles of Si/PDMS after transfer to a second temporary adhesive layer (second Si handler).
Figure 13:
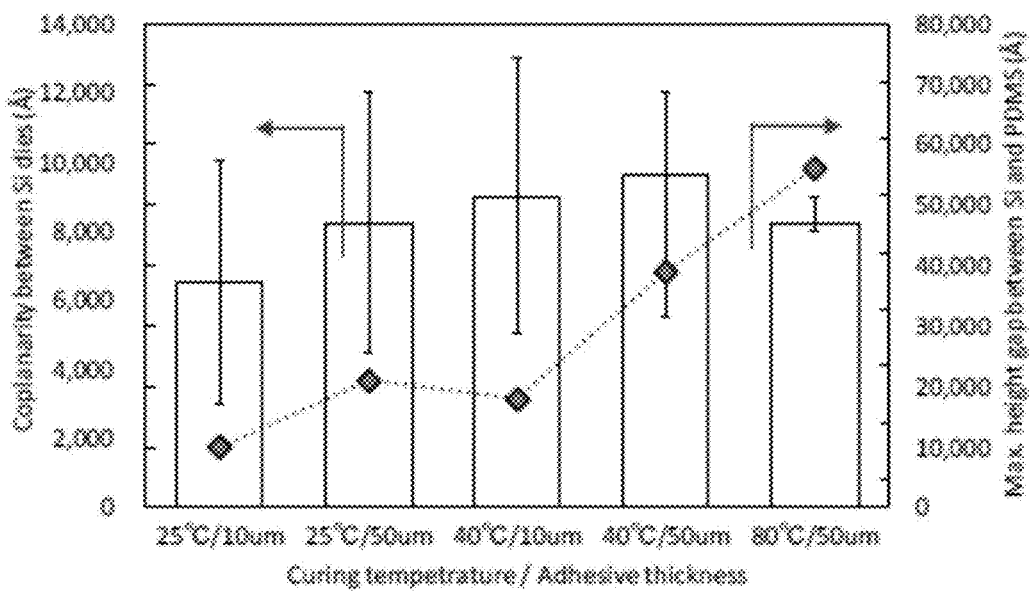
FIG. 13. Coplanarity of Si dies and height gap between Si and PDMS top surfaces after transfer to a second temporary adhesive layer (second Si handler).

FIG. 10 shows a surface profile of the adjacent dielets placed on the first temporary adhesive layer. Here, about 100 μm thick and about 1 mm square Si dielets are used with a total thickness variation (TTV) of about 1.5 μm. These dies are provided from GINTI (Tohoku Univ./T-Micro). As seen from this figure, there is less die tilt. The maximum height difference among the Si dies is about 1.5 μm similar to the dielet TTV values. After compression mold with PDMS, the small die array is transferred to the second Si handler, followed by the thermal detachment of the first handler. The surface profiles are evaluated in the following figures: FIG. 11 shows the impact of curing temperature on the coplanarity of Si dies and height gap among Si and PDMS top surfaces, whereas FIG. 12 shows the effect of adhesive thickness on the geometrical properties. As seen from FIG. 11, the height gap is gradually reduced with a decrease in curing temperature. This is due to diminished Brownian motion of PDMS backbones used as a mold resin because the glass transition temperature of PDMS is below room temperature. On the other hand, as seen from FIG. 12, a thinner adhesive layer (about 10 μm) can further reduce the height gap down to about 1 μm compared to the original adhesive thickness of about 50 μm. Although the edges of the dielets show locally high topography, these embossments result from low adhesion between the temporary adhesive and Si dielets, leading to infiltration of the uncured PDMS. However, the small embossments can be compensated with a spin-on passivation layer prior to metallization processes. An optically measured surface profile of 625 pieces of the small dies embedded in the PDMS is obtained, and FIG. 13 summarizes geometrical properties. In this example, two measures of coplanarity are specified: one is the maximum distance between the highest and lowest point among all the dies embedded in the PDMS. The other is specified as the maximum height gap between Si and PDMS top surfaces. As seen from FIG. 13, the former coplanarity is about 1.3 µm at most, and is not affected by curing temperature and adhesive thickness. The latter coplanarity was found to be <about 1 µm. Due to the low-temperature compression mold process, die shift in comparative FOWLP can be also suppressed.

Figure 14:
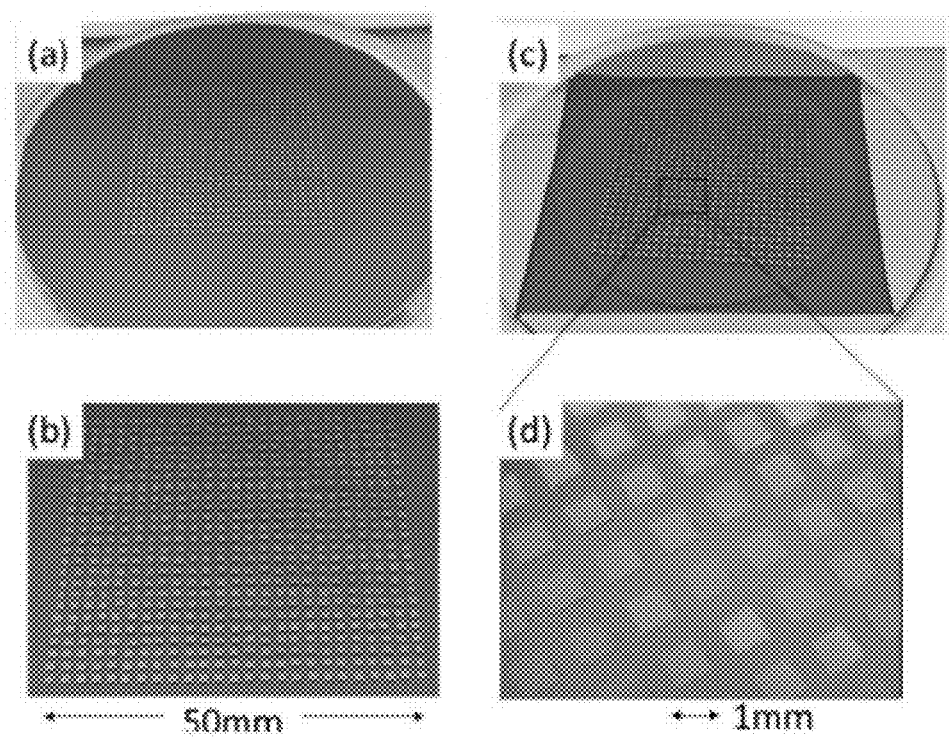
FIG. 14. Photomicrographs of multi-dies placed on a first Si handler (a)-(d) and multi-dies transferred to a second Si handler.
Figure 15:
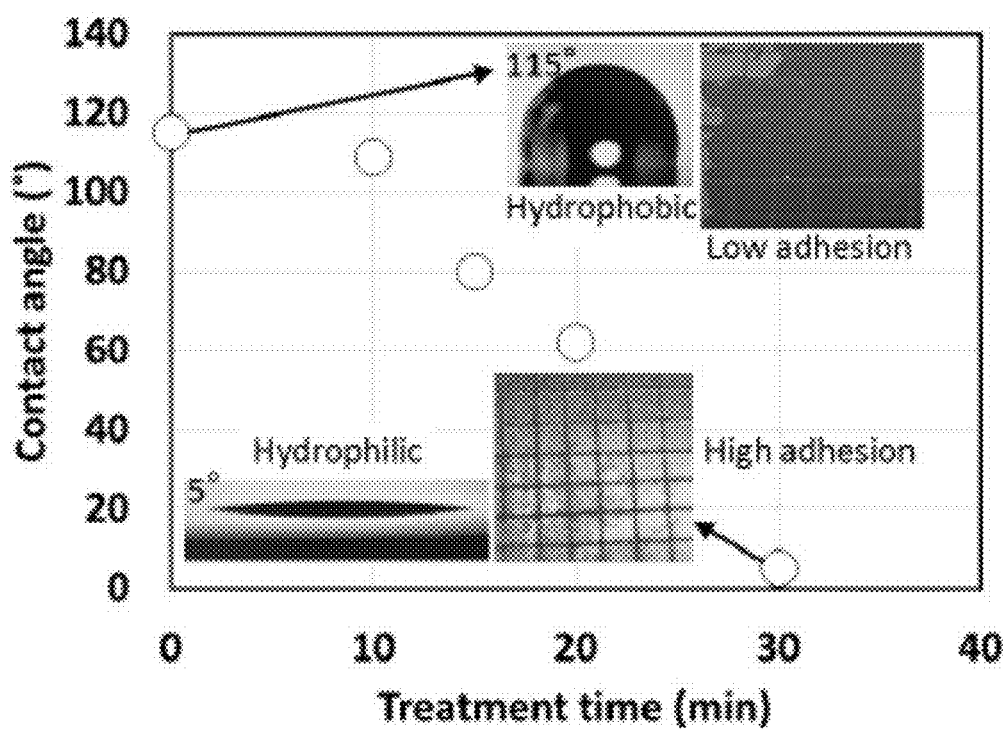
FIG. 15. Water contact angle shift as a function of surface modification time with ultraviolet (UV)/ozone ($O_3$), and their adhesion properties.
Figure 16:
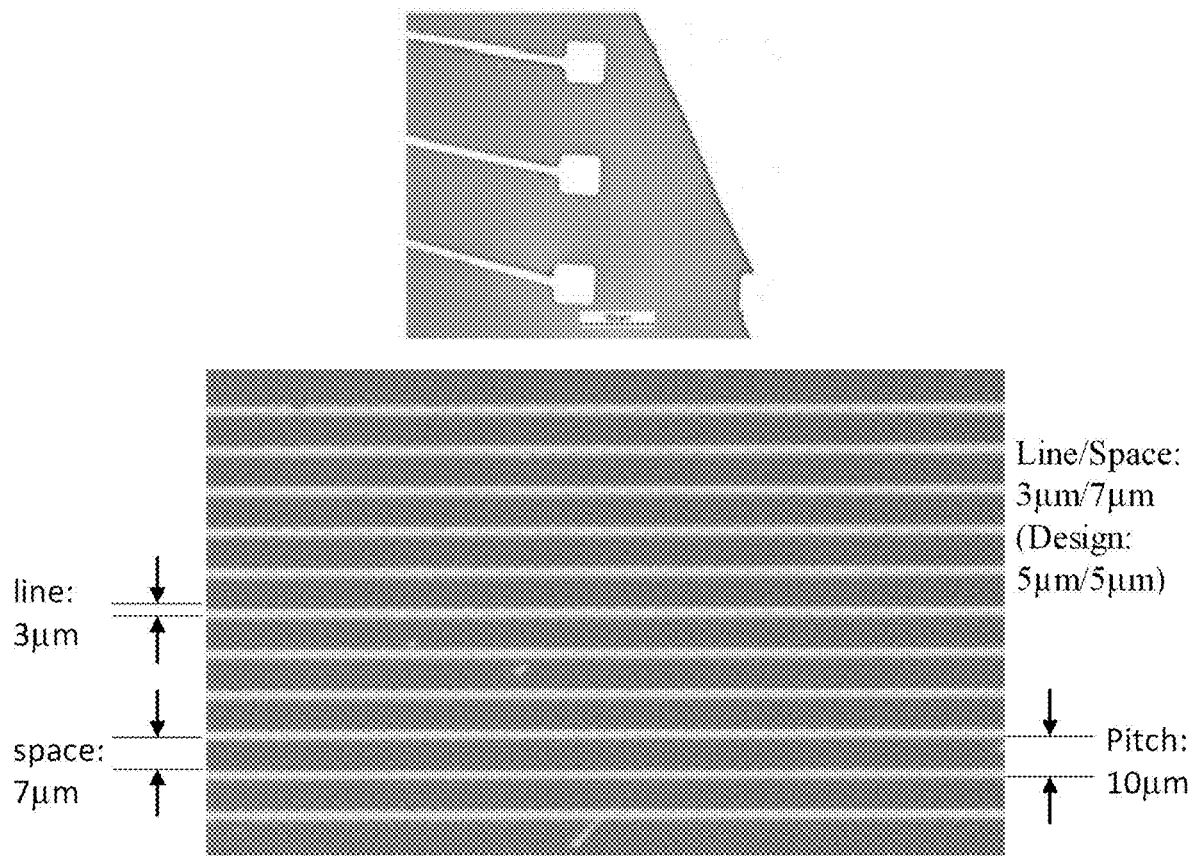
FIG. 16. An optical image of fine-pitch (line/space about 3 μm/about 7 μm) wirings formed on Si/PDMS at a wafer level.
Figure 17:
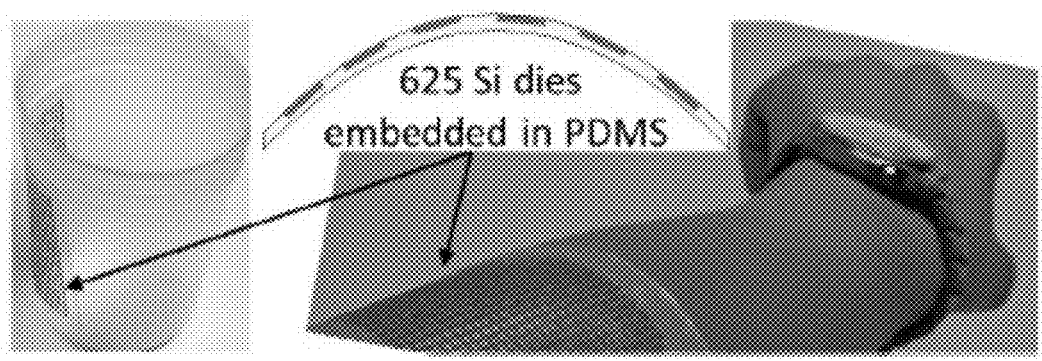
FIG. 17. Pictures of a wearable demonstrator.

As shown in FIG. 14, 625 square about 1 mm×about 1 mm dielets were assembled on the first Si handler, and were successfully transferred to the second handler. Then, the metallization with evaporated Ti/Au is performed on the PDMS and Si covered with an oxide layer. Surface modification was carried out to enhance the adhesion between the metal and PDMS. By using UV/$O_3$ treatment, the water contact angle is dramatically decreased, and consequently the surface is rendered highly hydrophilic as shown in FIG. 15. These hydrophilic surfaces can increase the adhesive strength between the metal and PDMS as seen from pictures insets in FIG. 15. As a result, fine-pitch wirings with a line/space of about 3 µm/about 7 µm are successfully formed on the Si and PDMS. FIG. 16 shows a photomicrograph of the resulting Ti/Au wirings. The electrical properties were characterized by I-V measurement, and excellent electrical properties were obtained. The resistance of the about 10 mm long Ti/Au wirings with a thickness of about 10/100 nm was measured, and it was found to be about 200Ω for about 100-nm-thick Ti/Au wirings. Finally, the structure is removed from the second handler. As shown in FIG. 17, the flexible substrate embedding large numbers of small Si dies in the biocompatible PDMS is bendable, wearable and implantable, and can be attached on curved surfaces such as a human arm or even inserted into a cranium.

Conclusion:

This example sets forth a flexible dielet assembly technology to fabricate a flexible device structure based on FOWLP with a biocompatible PDMS. Fine-pitch inter-dielet interconnects were successfully formed on a large number of small Si dielets embedded in the PDMS by using self-assembly, low-temperature compression mold, and multichip transfer technologies. The heterogeneous integration scheme can be used for next-generation IoT having various sensors and high-density interconnect networks on flexible substrates as well as wearable and implantable devices.

As used herein, the singular terms "a," "an," and "the" may include plural referents unless the context clearly dictates otherwise. Thus, for example, reference to an object may include multiple objects unless the context clearly dictates otherwise.

As used herein, the term "set" refers to a collection of one or more objects. Thus, for example, a set of objects can include a single object or multiple objects.

As used herein, the terms "connect," "connected," and "connection" refer to an operational coupling or linking. Connected objects can be directly coupled to one another or can be indirectly coupled to one another, such as via one or more other objects.

As used herein, the terms "substantially" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be "substantially" or "about" the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In the description of some embodiments, an object provided "on," "over," "on top of," or "below" another object can encompass cases where the former object is directly adjoining (e.g., in physical contact with) the latter object, as well as cases where one or more intervening objects are located between the former object and the latter object.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a range of about 1 to about 200 should be understood to include the explicitly recited limits of about 1 and about 200, but also to include individual values such as about 2, about 3, and about 4, and sub-ranges such as about 10 to about 50, about 20 to about 100, and so forth.

While the disclosure has been described with reference to the specific embodiments thereof, it should be understood by those skilled in the art that various changes may be made and equivalents may be substituted without departing from the true spirit and scope of the disclosure as defined by the appended claims. In addition, many modifications may be made to adapt a particular situation, material, composition of matter, method, operation or operations, to the objective, spirit and scope of the disclosure. All such modifications are intended to be within the scope of the claims appended hereto. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not a limitation of the disclosure.

What is claimed is:

1. A fan-out wafer level package, comprising:
   a flexible substrate;
   a semiconductor component embedded in the flexible substrate, the semiconductor component including an active surface that is exposed from the flexible substrate, the semiconductor component including a bonding pad adjacent to the active surface;
   a stress buffer layer disposed over the flexible substrate and the semiconductor component, the stress buffer layer defining an opening exposing the bonding pad of the semiconductor component; and
   an interconnect disposed over the stress buffer layer and including a portion extending into the opening of the stress buffer layer to electrically connect to the bonding pad of the semiconductor component.

2. The fan-out wafer level package of claim 1, wherein the flexible substrate includes a flexible material.

3. The fan-out wafer level package of claim 2, wherein the flexible material is an elastomer or a gel.

4. The fan-out wafer level package of claim 2, wherein the flexible material has a Young's modulus of up to 3 MPa.

5. The fan-out wafer level package of claim 2, wherein the flexible material has a percentage elongation-at-break of at least 5%.

6. The fan-out wafer level package of claim 1, wherein the interconnect extends beyond a lateral periphery of the semiconductor component.

7. The fan-out wafer level package of claim 6, further comprising a flexible layer disposed over the flexible substrate, the stress buffer layer, and the interconnect, the flexible layer defining an opening exposing a fan-out portion of the interconnect.

8. The fan-out wafer level package of claim 7, further comprising a fan-out contact or electrode disposed over the fan-out portion of the interconnect.

9. The fan-out wafer level package of claim 7, wherein the flexible layer includes an elastomer or a gel.

10. The fan-out wafer level package of claim 1, wherein the stress buffer layer includes a resin.

11. The fan-out wafer level package of claim 1, wherein the flexible substrate includes a top surface, the active surface of the semiconductor component is exposed from the flexible substrate adjacent to the top surface of the flexible substrate, and a vertical displacement between the active surface of the semiconductor component and the top surface of the flexible substrate is up to 30 μm.

12. The fan-out wafer level package of claim 1, wherein the semiconductor component is a first semiconductor component, and further comprising:
 a second semiconductor component embedded in the flexible substrate, the second semiconductor component including an active surface that is exposed from the flexible substrate.

13. The fan-out wafer level package of claim 12, wherein a thickness of the first semiconductor component is different from a thickness of the second semiconductor component.

14. The fan-out wafer level package of claim 12, wherein a vertical displacement between the active surface of the first semiconductor component and the active surface of the second semiconductor component is up to 30 μm.

15. A fan-out wafer level process, comprising:
 forming a first adhesive layer over a first handler;
 affixing semiconductor components to the first adhesive layer and the first handler, with active surfaces of the semiconductor components facing the first adhesive layer;
 applying a flexible material over the semiconductor components and the first adhesive layer;
 forming a second adhesive layer over a second handler;
 curing the flexible material with the second handler and the second adhesive layer applied over the flexible material, with the flexible material facing the second adhesive layer, thereby forming a flexible substrate in which the semiconductor components are embedded; and
 releasing the flexible substrate and the semiconductor components from the first adhesive layer and the first handler.

16. The fan-out wafer level process of claim 15, wherein the semiconductor components include a first die and a second die, and the first die and the second die have different thicknesses.

17. The fan-out wafer level process of claim 15, wherein the flexible material is an elastomer or a gel.

18. The fan-out wafer level process of claim 15, further comprising:
 forming interconnects over the semiconductor components and the flexible substrate.

19. The fan-out wafer level process of claim 18, further comprising:
 releasing the flexible substrate, the semiconductor components, and the interconnects from the second adhesive layer and the second handler.

20. The fan-out wafer level process of claim 18, further comprising:
 prior to forming the interconnects, applying a treatment to a surface of the flexible substrate to render the surface to be hydrophilic, and
 wherein at least a portion of the interconnects is formed over the hydrophilic surface of the flexible substrate.

* * * * *